United States Patent
Hwang et al.

(10) Patent No.: US 9,626,953 B2
(45) Date of Patent: Apr. 18, 2017

(54) VEHICLE AUDIO SYSTEM AND NOISE REMOVAL METHOD THEREOF

(71) Applicant: Hyundai Motor Company, Seoul (KR)

(72) Inventors: Seung Hai Hwang, Gyeonggi-do (KR); Ji Sun Go, Gyeonggi-do (KR); Young Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 50 days.

(21) Appl. No.: 14/569,718

(22) Filed: Dec. 14, 2014

(65) Prior Publication Data
US 2015/0356963 A1 Dec. 10, 2015

(30) Foreign Application Priority Data
Jun. 5, 2014 (KR) .......................... 10-2014-0068096

(51) Int. Cl.
G10K 11/175 (2006.01)
H03F 3/181 (2006.01)
H03F 3/217 (2006.01)

(52) U.S. Cl.
CPC .......... *G10K 11/175* (2013.01); *H03F 3/181* (2013.01); *H03F 3/217* (2013.01); *H03F 2200/321* (2013.01); *H03F 2200/351* (2013.01)

(58) Field of Classification Search
CPC ....... G10K 11/175; H03F 3/181; H03F 3/217; H03F 2200/321; H03F 2200/351
See application file for complete search history.

(56) References Cited

U.S. PATENT DOCUMENTS

| 7,463,903 B2 | 12/2008 | Boarin et al. |
| 2005/0097154 A1* | 5/2005 | Tsecouras .............. H04B 15/00 708/300 |
| 2006/0247810 A1* | 11/2006 | Risbo ...................... H03F 3/217 700/94 |
| 2007/0142010 A1 | 6/2007 | Christopher |

FOREIGN PATENT DOCUMENTS

| JP | 2006-313958 A | 11/2006 |
| JP | 2011-182280 A | 9/2011 |
| KP | 10-2007-0099929 A | 10/2007 |
| KR | 10-2007-0009050 A | 1/2007 |
| KR | 20-2008-0004684 | 10/2008 |
| KR | 10-2010-0073650 A | 7/2010 |
| KR | 10-0999158 B1 | 12/2010 |
| KR | 10-1108143 B1 | 2/2012 |

\* cited by examiner

*Primary Examiner* — Regina N Holder
(74) *Attorney, Agent, or Firm* — Mintz Levin Cohn Ferris Glovsky and Popeo, P.C.; Peter F. Corless

(57) ABSTRACT

A vehicle audio system includes: a tune knob configured to select a frequency of a desired radio broadcast; a microcomputer configured to detect a broadcast frequency input through the tune knob and to determine an optimal sampling frequency of a full digital amplifier based on the detected broadcast frequency; a tuner configured to receive only a broadcast signal corresponding to the frequency selected through the tune knob; and the full digital amplifier configured to generate a digital signal by sampling the broadcast signal received by the tuner at the optimal sampling frequency determined by the microcomputer and to amplify and output the generated digital signal.

12 Claims, 6 Drawing Sheets

: Region having no influence of noise

: Region having no influence of noise

: Region having no influence of noise

VEHICLE AUDIO SYSTEM AND NOISE REMOVAL METHOD THEREOF

CROSS-REFERENCE TO RELATED APPLICATION

This application claims under 35 U.S.C. §119(a) the benefit of and priority to Korean Patent Application No. 10-2014-0068096 filed on Jun. 5, 2014, the entire contents of which are incorporated herein by reference.

BACKGROUND (a) Technical Field

The present disclosure relates to a vehicle audio system and a noise removal method thereof, and more particularly, to a vehicle audio system and a noise removal method thereof, which can efficiently remove noise that may be generated in a vehicle audio system employing a full digital amplifier.

(b) Background Art

In general, a vehicle audio system enables listeners to listen to the radio, as well as various sound sources stored in analog form using an external media device (e.g., CD, MP3, etc.). An ordinary vehicle audio system typically uses an amplifier for amplifying audio signals and a speaker for outputting audio signals to provide sounds to the driver and passengers. Meanwhile, a digital amplifier generally refers to an amplifier that directly receives digital signals, amplifies the received digital signals in a digital form without converting the digital signals into analog form, and applies the amplified digital signals to a speaker.

Currently, the process of converting the form of an audio amplifier stage into digital form is unsatisfactory, and therefore, the conventional analog scheme is frequently used. To this point, a conventional audio amplifier used in a vehicle, for example, is configured to include a digital-analog converter and an AB-class amplifier. The conventional audio amplifier receives a pulse code modulation (PCM) signal, modulates the received PCM signal into an analog signal through the digital-analog converter, and amplifies the modulated analog signal through the AB-class amplifier. Also, the amplified signal has noise removed by passing through an LC low pass filter and is then output through a speaker.

However, the conventional amplifier generates a large amount of heat in an amplifier circuit, and accordingly, the size of a heat sink is also relatively large. As the size of the heat sink increases, the design of the vehicle becomes increasingly limited, and the fuel efficiency of the vehicle is also decreased. In addition, a complicated circuit may be necessary to remove noise.

In order to solve the above-described problems of the conventional audio amplifier, a vehicle audio system using a full digital amplifier has recently been made, and the present applicant has filed a patent application [No. 10-2013-016525 (2013-12-27)] related to an audio amplification method and an audio amplification circuit. The method and circuit disclosed therein can solve the problem of excessive heat generation using a full digital amplifier as the vehicle amplifier and can amplify a PCM signal directly input without using a digital signal processing (DSP) chip or analog-digital converter.

FIG. 1 is a block diagram illustrating an internal configuration of a conventional audio amplifier. Referring to FIG. 1, a full digital amplifier 40 applied to a vehicle audio system generates a pulse width modulation (PWM) signal from a PCM signal input to a PWM generator 41, amplifies the PWM signal through a D-class amplifier 43 and then outputs the amplified PWM signal to an LC filter 50. The digital signal output from the full digital amplifier 40 has noise removed by passing through the LC filter 50 and is then output through a speaker 60 so that a user can listen to the signal.

In this state, the PWM generator 41 samples the input PCM signal at high speed and then generates a PWM signal through a noise shaping technique. The following processes are performed for the purpose of this signal processing.

First, a digitized sound source signal is input.

Second, the input signal is over-sampled eight times faster than the existing sampling frequency.

Third, noise is moved posterior to the audio frequency through the noise shaping technique.

Fourth and finally, the digital signal is amplified through the D-class amplifier, and a sound signal in an analog form is then extracted and output through the LC filter, thereby reproducing a sound source.

However, in the conventional audio amplifier to which the full digital amplifier is applied, there is a problem in that harmonic noise can be generated in the period of a sampling frequency when a digital signal is sampled at high frequency in signal processing. In this state, when two or three times harmonic noise is generated in the AM frequency region that is a region of radio broadcast frequencies, the harmonic noise has influence on the noise itself. In addition, the harmonic noise may have influence on the harmonic frequency for each carrier signal, even in the FM frequency region.

SUMMARY OF THE DISCLOSURE

The present disclosure provides a vehicle audio system and a noise removal method thereof, which can efficiently remove noise that may be generated in a process in which a full digital amplifier samples a broadcast signal at high frequency when the broadcast signal is processed using the full digital amplifier.

According to embodiments of the present disclosure, a vehicle audio system includes: a tune knob configured to select a frequency of a desired radio broadcast; a microcomputer configured to detect a broadcast frequency input through the tune knob and to determine an optimal sampling frequency of a full digital amplifier based on the detected broadcast frequency; a tuner configured to receive only a broadcast signal corresponding to the frequency selected through the tune knob; and the full digital amplifier configured to generate a digital signal by sampling the broadcast signal received by the tuner at the optimal sampling frequency determined by the microcomputer and to amplify and output the generated digital signal.

The vehicle audio system may further include a low pass filter configured to extract and output only a low frequency portion of the digital signal amplified and output from the full digital amplifier; and a speaker configured to output a signal passing through the low pass filter.

The microcomputer may set and store optimal sampling frequencies of the full digital amplifier at every predetermined region thereof.

Furthermore, according to embodiments of the present invention, a method for removing noise of a vehicle audio system includes: detecting a frequency of a radio broadcast selected by a user through a tune knob; determining, by a microcomputer, an optimal sampling frequency of a full digital amplifier based on the detected frequency of the selected radio broadcast; receiving, by a tuner, only a broadcast signal corresponding to the detected frequency of the selected radio broadcast; generating, by the full digital amplifier, a digital signal by sampling the received broadcast signal at the determined optimal sampling frequency; and amplifying and outputting the generated digital signal.

The method may further include: extracting, by a low pass filter, only a low frequency portion of the amplified and output digital signal; and outputting the extracted signal through a speaker.

The microcomputer may set and store optimal sampling frequencies of the full digital amplifier at every predetermined region thereof.

In the vehicle audio system and the method thereof according to the present disclosure, it is possible to remove influence of undesirable harmonic noise generated by high-speed sampling of the full digital amplifier when the full digital amplifier is applied to the vehicle audio system, thereby preventing deterioration of reception performance. Further, it is possible to efficiently remove noise without adding any additional physical/hardware components, such that a full digital amplifier may be readily implemented in an actual vehicle audio system without an increase in cost.

The above and other features of the present disclosure are discussed infra.

BRIEF DESCRIPTION OF THE DRAWINGS

The above and other features of the present disclosure will now be described in detail with reference to embodiments thereof illustrated the accompanying drawings which are given hereinbelow by way of illustration only, and thus are not limitative of the present disclosure, wherein.

Figure 1:
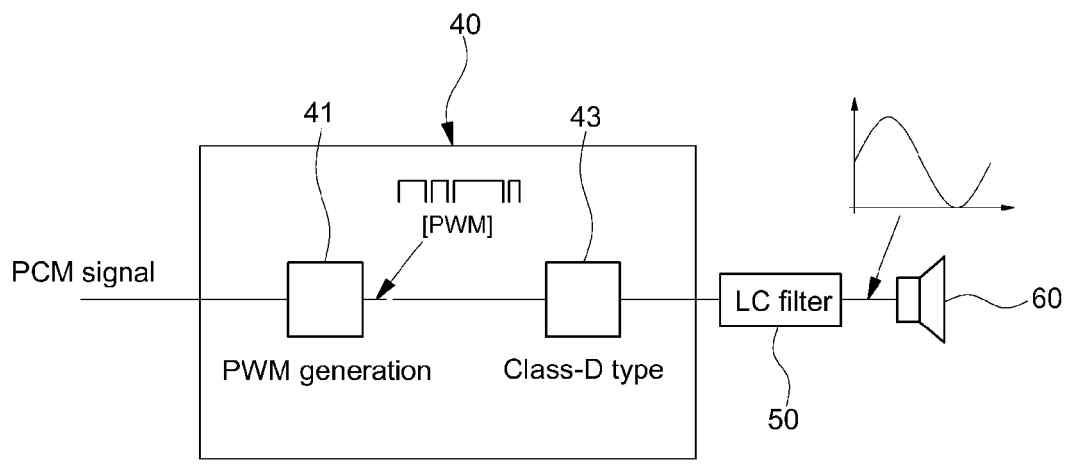
FIG. 1 is a block diagram illustrating an internal configuration of a conventional audio amplifier.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment. In the figures, reference numbers refer to the same or equivalent parts of the present disclosure throughout the several figures of the drawing.

DETAILED DESCRIPTION

Hereinafter, reference will be made in detail to embodiments of the present disclosure, examples of which are illustrated in the accompanying drawings and described below. While the disclosure will be described in conjunction with embodiments, it will be understood that present description is not intended to limit the disclosure to those embodiments. On the contrary, the disclosure is intended to cover not only the disclosed embodiments, but also various alternatives, modifications, equivalents and other embodiments, which may be included within the spirit and scope of the disclosure as defined by the appended claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The disclosed embodiments are used to efficiently remove noise that may be generated in a vehicle audio system employing a full digital amplifier. In the present disclosure, influence due to harmonic noise generated by high-speed sampling of the full digital amplifier is efficiently interrupted, thereby preventing deterioration of reception performance with respect to radio broadcasting.

Figure 2:
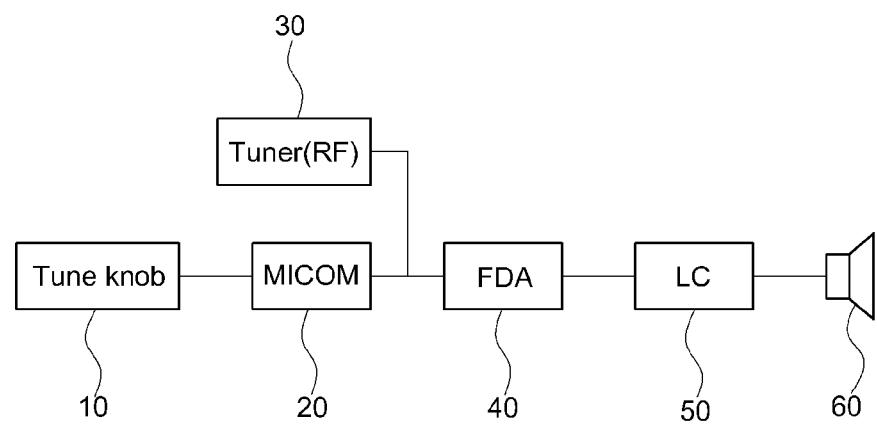
FIG. 2 is a schematic diagram illustrating a vehicle audio system according to embodiments of the present disclosure.

As shown in FIG. 2, a vehicle audio system according to embodiments of the present disclosure includes a tune knob 10, a microcomputer 20, a tuner 30, a full digital amplifier 40, a low pass filter 50, a speaker 60, and the like. The tune knob 10 is a dial that allows a user (e.g., a passenger of a vehicle) to select a desired radio broadcast. The user may select a frequency of a desired radio broadcast by, for example, adjusting the rotational amount of the tune knob 10.

The microcomputer 20 is connected to the tune knob 10 to detect a broadcast frequency selected through a rotational amount of the tune knob 10, determine an optimal sampling frequency of the full digital amplifier 40 based on the detected broadcast frequency, and transmit information on the determined optimal frequency to the full digital amplifier 40. The optimal sampling frequency is determined before the full digital amplifier 40 samples a broadcast signal (i.e., digitized sound source signal) of the tuner 30. The tuner 30 receives, e.g., wirelessly, only a broadcast signal corresponding to the broadcast frequency detected by the microcomputer 20, i.e., the broadcast frequency selected through the tune knob 10.

The microcomputer 20 can previously set and store information on optimal sampling frequencies of the full digital amplifier 40 every broadcast frequency of a predetermined region thereof. If a broadcast frequency selected by the user is input through the tune knob 10, information associated with an optimal sampling frequency corresponding to the broadcast frequency is transmitted to the full digital amplifier 40. For example, the microcomputer 20 may store a map set by previously confirming an optimal sampling frequency not influenced by noise every broadcast frequency of a predetermined band. If a predetermined broadcast frequency is input from the tune knob 10, the map outputs a sampling frequency matched to the input broadcast frequency.

Figure 3:
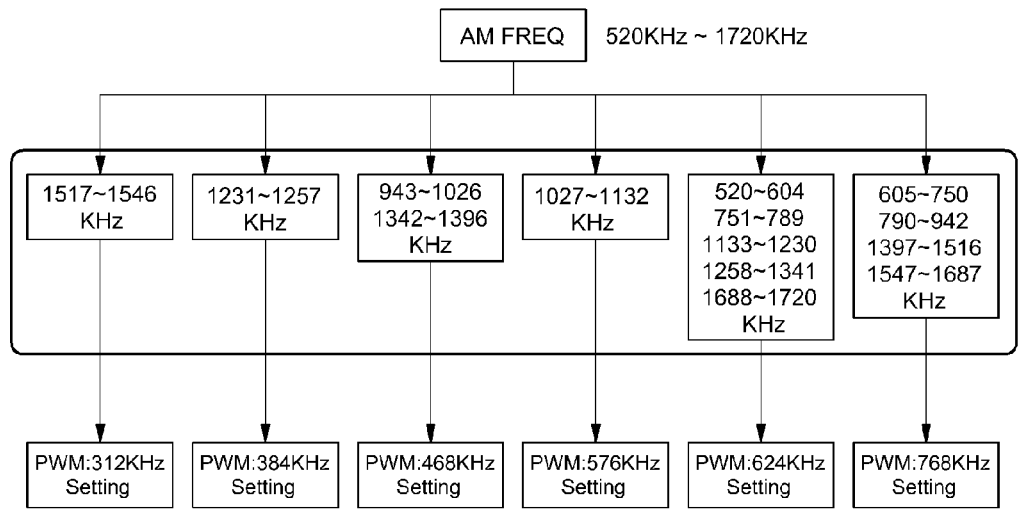
FIGS. 3 and 4 are exemplary diagrams illustrating a sampling frequency previously set in a full digital amplifier employed in the vehicle audio system according to embodiments of the present disclosure.
Figure 4:
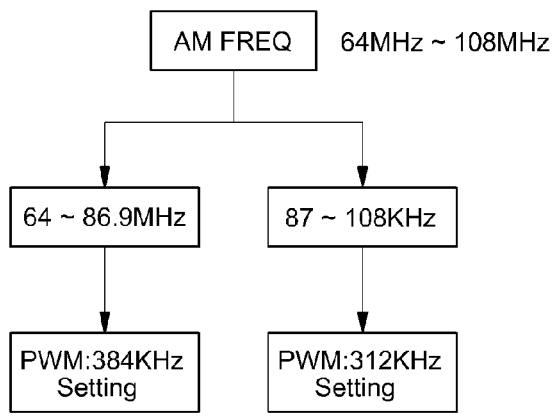

Referring to FIGS. 3 and 4, if a predetermined broadcast frequency is input through the tune knob 10, the map stored in the microcomputer 20 outputs information on a sampling frequency matched to a predetermined frequency band in which the broadcast frequency is included. For example, if a broadcast frequency corresponding to an AM frequency region of 1517 to 1546 KHz is input, 312 KHz matched to the input broadcast frequency is output as an optimal sampling frequency. If a broadcast frequency corresponding to an AM frequency region of 1231 to 1257 KHz is input, 384 KHz matched to the input broadcast frequency is output as an optimal sampling frequency.

Accordingly, if a broadcast frequency input from the tune knob 20 is detected, the microcomputer 20 determines a sampling frequency matched to the detected broadcast frequency and transmits the determined sampling frequency to the full digital amplifier 40. The full digital amplifier 40 is a digital amplifier for amplifying a broadcast signal (or audio signal) in a pulse width modulation (PWM) pulse manner. The full digital amplifier 40 receives a digitized broadcast signal input from the tuner 30 to finally generate a PWM digital output by going through digital amplifier processing through digital signal processing. As known in the art, a digital amplifier pulse width modulates a digital signal with a small amplitude, such as a pulse code modulation (PCM) signal, into a PWM signal, and then amplifies the amplitude of the PWM signal using a semiconductor switching element, such as a field effect transistor (FET).

The full digital amplifier 40 receiving information on the sampling frequency input from the microcomputer 20 samples and outputs the input broadcast signal, i.e., the digitized broadcast signal received from the tuner 30, at the sampling frequency determined by the microcomputer 20. The PWM digital signal output from the full digital amplifier 40 has noise removed by passing through the low pass filter 50 and is then output through the speaker 60 so that the user can listen to the signal. That is, if the low pass filter 50 connected to the full digital amplifier 40 extracts (i.e., passes) and outputs only a low portion of the digital signal output through sampling and amplification in the full digital amplifier 40, the speaker 60 outputs the signal passing through the low pass filter 50 so that the user can listen to the signal. As known in the art, the low pass filter performs a function of passing a frequency lower than a predetermined cutoff frequency and attenuating a frequency higher than the predetermined cutoff frequency.

With respect to the problem of heat generation, the full digital amplifier 40 is beneficial as compared to the conventional analog amplifier, such as an AB-class amplifier which amplifies an analog signal, and does not require a heat sink with large volume, and the like, thereby reducing the volume of the amplifier. Further, the full digital amplifier 40 converts a digital PCM signal into a PWM signal without using a digital-analog converter (DAC) process, as compared with a general D-class amplifier that converts a digital PCM signal into an analog signal through a DAC and then converts the analog signal into a PWM signal in conversion from PCM into PWM, thereby reducing gain loss occurring in the DAC process.

A method of removing influence of noise and receiving and reproducing a radio broadcast signal in the vehicle audio system configured as described above may include detecting the frequency of a radio broadcast selected by a user through the tune knob 10; determining, by the microcomputer 20, an optimal sampling frequency of the full digital amplifier 40; receiving only a broadcast signal corresponding to the frequency of the radio broadcast selected by the tuner 30; generating, by the full digital amplifier 40, a digital signal by sampling the received broadcast signal (i.e., PCM signal) at the optimal sampling frequency and then amplifying and outputting the generated digital signal; and extracting, by the low pass filter 50, only a low frequency portion from the amplified and output digital signal and then outputting the extracted signal to the exterior through the speaker 60.

In the process of determining the optimal sampling frequency, the optimal sampling frequency is determined as a sampling frequency previously set with respect to a predetermined frequency region in which the broadcast frequency selected through the tune knob 10 is included among optimal sampling frequencies respectively set every predetermined frequency region. Meanwhile, as a result in which the circumference of a signal output from the existing digital amplifier using one sampling frequency is measured using a spectrum analyzer, it can be seen that noise has influence on a period of 520 KHz to 1.72 MHz. Accordingly, results in which influence of noise is confirmed by selecting different sampling frequencies every predetermined frequency region are shown in FIGS. 5 to 7.

Figure 5:
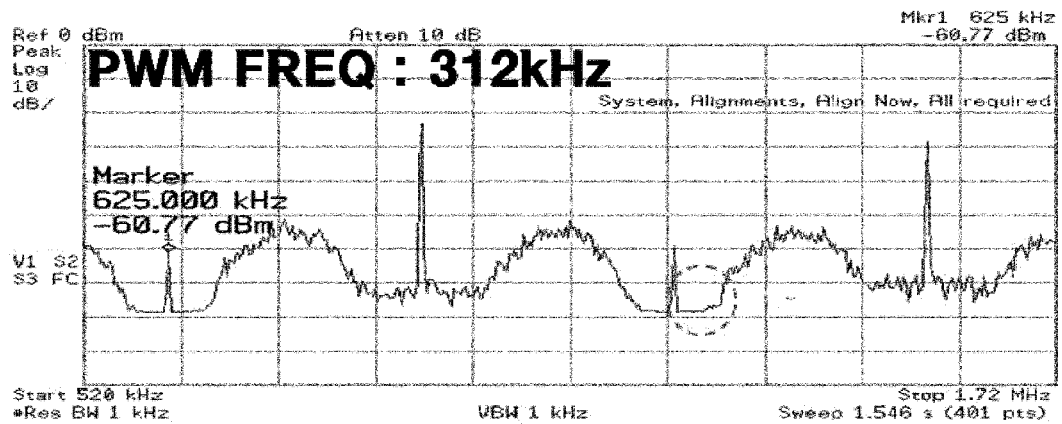
FIGS. 5 to 7 are graphs confirming that there is no influence of noise in a predetermined frequency region in the use of a sampling frequency set in the full digital amplifier of the vehicle audio system according to embodiments of the present disclosure.
Figure 5:
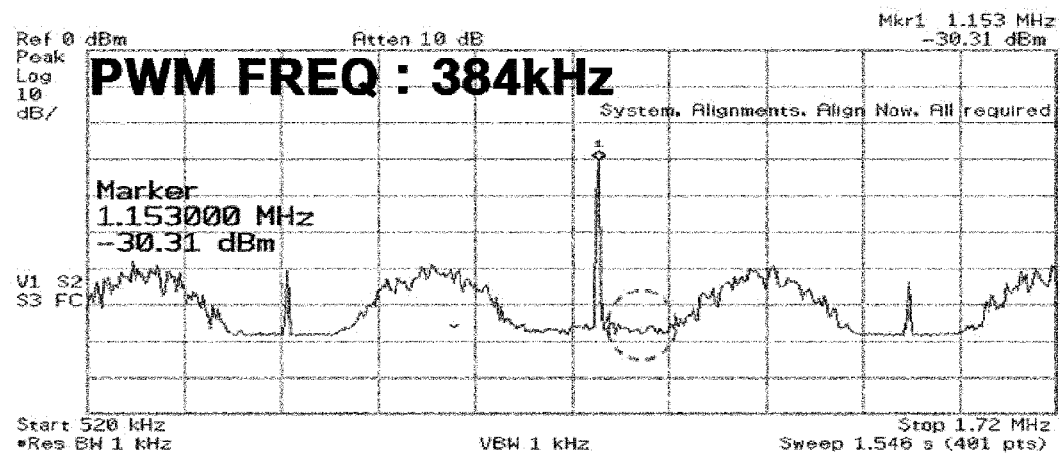
Figure 5:

As a result in which the sampling frequency of the full digital amplifier is set as 312 KHz, and the circumference of a digital signal output from the full digital amplifier is measured using the spectrum analyzer, it can be seen that there is no noise interference in an AM frequency region of 1517 to 1546 KHz as shown in the upper graph of FIG. 5. That is, it can be seen that, if 312 KHz is used as the sampling frequency in the AM frequency region of 1517 to 1546 KHz, radio broadcast signals can be received without influence of noise.

As a result in which the sampling frequency of the full digital amplifier is set as 384 KHz, and the circumference of a digital signal output from the full digital amplifier is measured using the spectrum analyzer, it can be seen that there is no noise interference in an AM frequency region of 1231 to 1257 KHz as shown in the lower graph of FIG. 5. That is, it can be seen that, if 384 KHz is used as the sampling frequency in the AM frequency region of 1231 to 1257 KHz, radio broadcast signals can be received without influence of noise.

Figure 6:
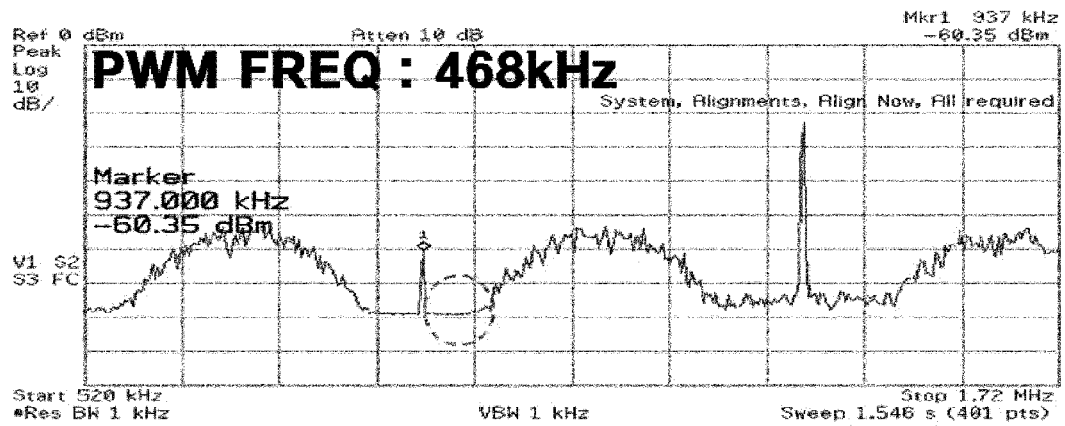
Figure 6:
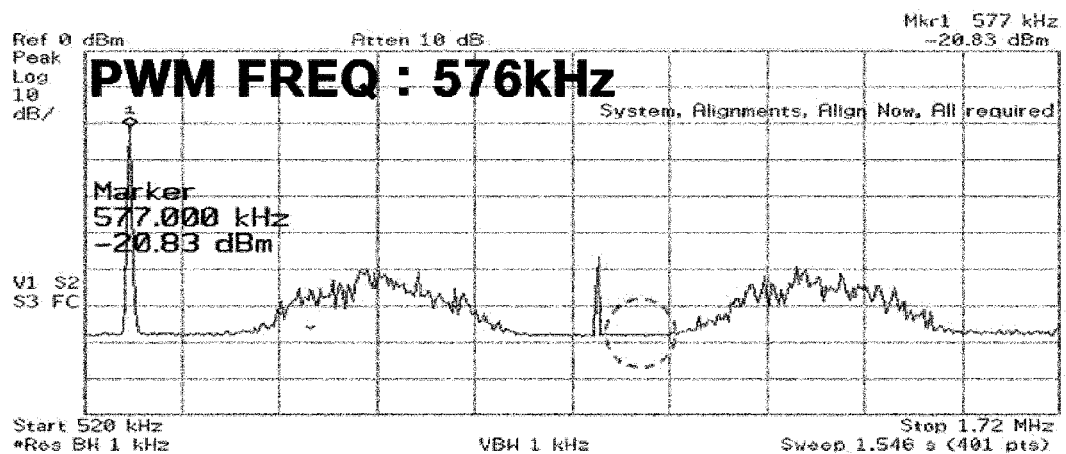
Figure 6:
Figure 7:
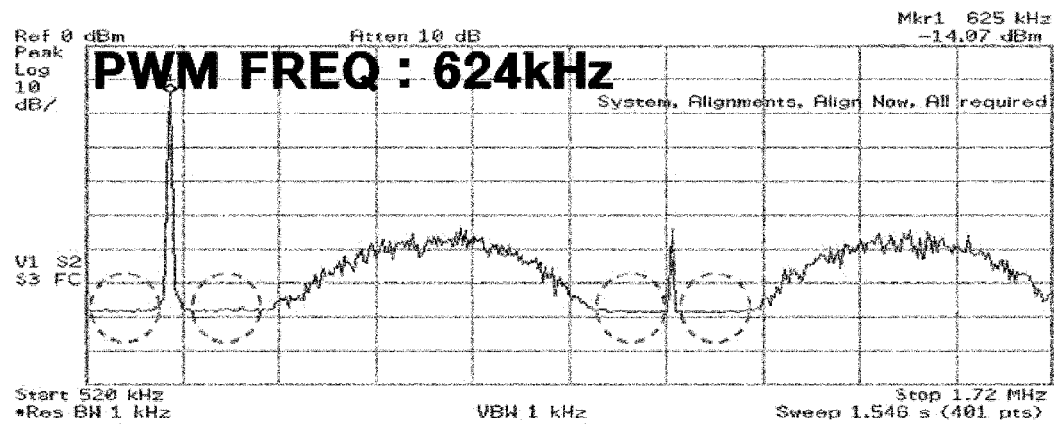
Figure 7:
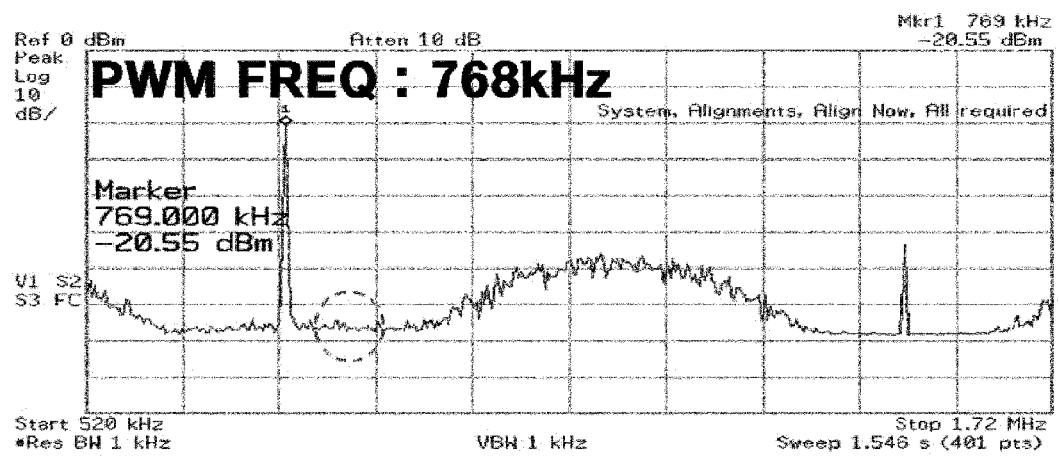
Figure 7:

As a result in which the sampling frequency of the full digital amplifier is set as 468 KHz, and the circumference of a digital signal output from the full digital amplifier is measured using the spectrum analyzer, it can be seen that there is no noise interference in AM frequency regions of 943 to 1026 KHz and 1342 to 1396 KHz as shown in the upper graph of FIG. 6. That is, it can be seen that, if 468 KHz is used as the sampling frequency in the AM frequency regions of 943 to 1026 KHz and 1342 to 1396 KHz, radio broadcast signals can be received without influence of noise.

As a result in which the sampling frequency of the full digital amplifier is set as 576 KHz, and the circumference of a digital signal output from the full digital amplifier is measured using the spectrum analyzer, it can be seen that there is no noise interference in an AM frequency region of 1027 to 1132 KHz as shown in the lower graph of FIG. 6. That is, it can be seen that, if 576 KHz is used as the sampling frequency in the AM frequency region of 1027 to 1132 KHz, radio broadcast signals can be received without influence of noise.

As a result in which the sampling frequency of the full digital amplifier is set as 624 KHz, and the circumference of a digital signal output from the full digital amplifier is measured using the spectrum analyzer, it can be seen that there is no noise interference in AM frequency regions of 520 to 604 KHz, 751 to 789 KHz, 1133 to 1230 KHz and 1258 to 1341 KHz as shown in the upper graph of FIG. 7. That is, it can be seen that, if 624 KHz is used as the sampling frequency in the AM frequency regions of 520 to 604 KHz, 751 to 789 KHz, 1133 to 1230 KHz and 1258 to 1341 KHz, radio broadcast signals can be received without influence of noise.

As a result in which the sampling frequency of the full digital amplifier is set as 768 KHz, and the circumference of a digital signal output from the full digital amplifier is measured using the spectrum analyzer, it can be seen that there is no noise interference in AM frequency regions of 605 to 750 KHz, 790 to 942 KHz, 1397 to 1516 KHz and 1547 to 1687 KHz as shown in the lower graph of FIG. 7. That is, it can be seen that, if 768 KHz is used as the sampling frequency in the AM frequency regions of 605 to 750 KHz, 790 to 942 KHz, 1397 to 1516 KHz and 1547 to 1687 KHz, radio broadcast signals can be received without influence of noise.

In addition, it can be seen that, if 384 KHz is used as the sampling frequency in an FM frequency region of 64 to 86.8 MHz, radio broadcast signals can be received without influence of noise. Further, it can be seen that, if 312 KHz is used as the sampling frequency in an FM frequency region of 87 to 108 MHz, radio broadcast signals can be received without influence of noise. As a result in which the influence of noise is confirmed by changing the sampling frequency for each predetermined frequency region as described above, it can be seen that influence of harmonic noise is removed using a predetermined sampling frequency.

Figure 8:
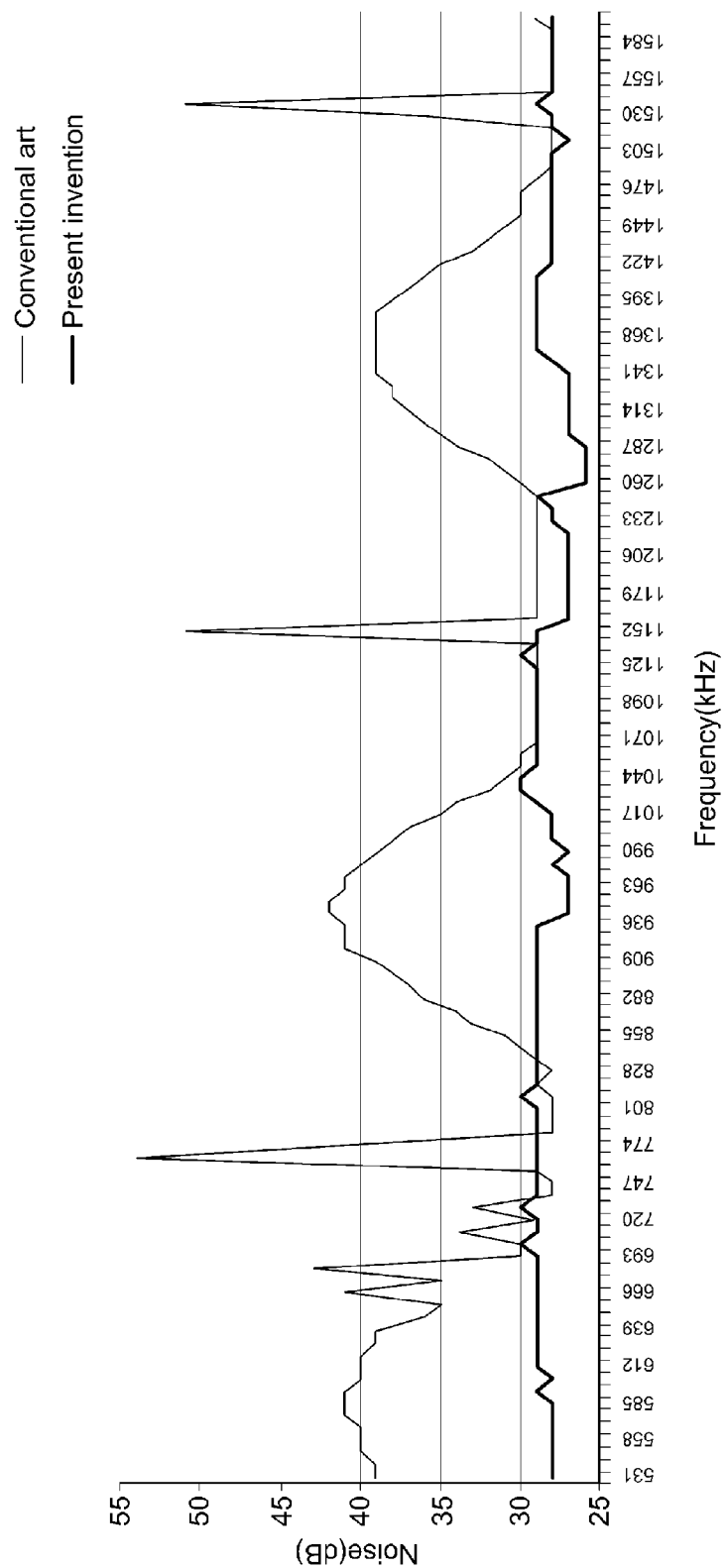
FIG. 8 is a graph illustrating a noise removal effect of the vehicle audio system according to embodiments of the present disclosure.

FIG. 8 is a graph comparing a result obtained by measuring a noise effect of a radio broadcast signal finally received in the vehicle audio system according to the present disclosure with that obtained by measuring a noise effect of a radio broadcast signal finally received in the conventional vehicle audio system. As shown in FIG. 8, when radio broadcast signals are received using one sampling frequency according to conventional techniques, a large harmonic noise of a noise reference level (32 dB) or more is generated in high-speed sampling of the full digital amplifier. Therefore, reception performance is influenced by the harmonic noise. However, when radio broadcast signals are received using optimal sampling frequencies every predetermined frequency region according to the present disclosure, the generation of additional noise is substantially prevented in high-speed sampling of the full digital amplifier.

As described above, in the vehicle audio system according to the present disclosure, it is possible to remove influence of harmonic noise that may be generated due to high-speed sampling of the full digital amplifier, thereby improving reception performance. Thus, it is possible to ensure clear sound quality without noise in reception of a radio broadcast.

Accordingly, the full digital amplifier can be readily employed in the vehicle audio system employing, and various effects can be expected as the full digital amplifier is applied to the vehicle audio system. For example, if a full digital amplifier having an efficiency of 90% or more is applied to a vehicle audio system, unlike with the conventional analog amplifier, the DSP function that was conventionally used in a vehicle can be used in the full digital amplifier, so that a high-priced DSP chip can be eliminated, thereby reducing unit cost. Further, the full digital amplifier substantially reduces heat generation, and thus, it does not require a heat dissipation device, such as a heat sink, thereby reducing the volume of the amplifier.

The disclosure has been described in detail with reference to embodiments thereof. However, it will be appreciated by those skilled in the art that changes may be made in these embodiments without departing from the principles and spirit of the disclosure, the scope of which is defined in the appended claims and their equivalents.

What is claimed is:

1. A vehicle audio system, comprising:
  a tune knob configured to select a frequency of a desired radio broadcast;
  a microcomputer configured to detect a broadcast frequency input through the tune knob and to determine an optimal sampling frequency of a full digital amplifier based on the detected broadcast frequency;
  a tuner configured to receive only a broadcast signal corresponding to the frequency selected through the tune knob; and
  the full digital amplifier configured to generate a digital signal by sampling the broadcast signal received by the tuner at the optimal sampling frequency that is previously determined and stored in a map by the microcomputer before the full digital amplifier samples the broadcast signal of the tuner and to amplify and output the generated digital signal,
  wherein the microcomputer is configured to store the map that is previously set by confirming the optimal sampling frequency not influenced by noise at every broadcast frequency of a predetermined band, and when a broadcast frequency is input from the tune knob, the map stored in the microcomputer outputs the optimal sampling frequency matched to the input broadcast frequency.

2. The vehicle audio system of claim 1, further comprising:
  a low pass filter configured to extract and output only a low frequency portion of the digital signal amplified and output from the full digital amplifier; and
  a speaker configured to output a signal passing through the low pass filter.

3. A method for removing noise of a vehicle audio system, the method comprising:
  detecting a frequency of a radio broadcast selected by a user through a tune knob;
  determining, by a microcomputer, an optimal sampling frequency of a full digital amplifier based on the detected frequency of the selected radio broadcast;
  receiving, by a tuner, only a broadcast signal corresponding to the detected frequency of the selected radio broadcast;
  generating, by the full digital amplifier, a digital signal by sampling the received broadcast signal at the determined optimal sampling frequency; and
  amplifying and outputting the generated digital signal,
  wherein the microcomputer stores a map that is previously set by confirming the optimal sampling frequency not influenced by noise at every broadcast frequency of a predetermined band, and when a broadcast frequency is input from the tune knob, the map stored in the microcomputer outputs the optimal sampling frequency matched to the input broadcast frequency, and wherein the optimal sampling frequency is previously determined and stored in the map by the microcomputer before the full digital amplifier samples the broadcast signal of the tuner.

4. The method of claim 3, further comprising:

extracting, by a low pass filter, only a low frequency portion of the amplified and output digital signal; and outputting the extracted signal through a speaker.

5. The method of claim 3, wherein, when the predetermined broadcast frequency is corresponding to an AM frequency region of 1517 to 1546 KHz as input, the optimal sampling frequency as output is 312 KHz matched to the input broadcast frequency.

6. The method of claim 3, wherein, when the predetermined broadcast frequency is corresponding to an AM frequency region of 1231 to 1257 KHz as input, the optimal sampling frequency as output is 384 KHz matched to the input broadcast frequency.

7. The method of claim 3, wherein, when the predetermined broadcast frequency is corresponding to an AM frequency region of 943 to 1026 KHz and an AM frequency region of 1342 to 1396 KHz as input, the optimal sampling frequency as output is 468 KHz matched to the input broadcast frequency.

8. The method of claim 3, wherein, when the predetermined broadcast frequency is corresponding to an AM frequency region of 1027 to 1132 KHz as input, the optimal sampling frequency as output is 576 KHz matched to the input broadcast frequency.

9. The method of claim 3, wherein, when the predetermined broadcast frequency is corresponding to AM frequency regions of 520 to 604 KHz, 751 to 789 KHz, 1133 to 1230 KHz and 1258 to 1341 KHz as input, the optimal sampling frequency as output is 624 KHz matched to the input broadcast frequency.

10. The method of claim 3, wherein, when the predetermined broadcast frequency is corresponding to AM frequency regions of 605 to 750 KHz, 790 to 942 KHz, 1397 to 1516 KHz, and 1547 to 1687 KHz as input, the optimal sampling frequency as output is 768 KHz matched to the input broadcast frequency.

11. The method of claim 3, wherein, when the predetermined broadcast frequency is corresponding to an FM frequency region of 64 to 86.8 MHz as input, the optimal sampling frequency as output is 384 KHz matched to the input broadcast frequency.

12. The method of claim 3, wherein, when the predetermined broadcast frequency is corresponding to an FM frequency region of 87 to 108 MHz as input, the optimal sampling frequency as output is 312 KHz matched to the input broadcast frequency.

* * * * *